US009320124B2

(12) United States Patent
Kataoka

(10) Patent No.: US 9,320,124 B2
(45) Date of Patent: Apr. 19, 2016

(54) RECORDING APPARATUS

(71) Applicant: Seiko Epson Corporation, Tokyo (JP)

(72) Inventor: Hideyuki Kataoka, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 201 days.

(21) Appl. No.: 13/792,766

(22) Filed: Mar. 11, 2013

(65) Prior Publication Data

US 2013/0279062 A1 Oct. 24, 2013

(30) Foreign Application Priority Data

Apr. 24, 2012 (JP) ................................ 2012-098465

(51) Int. Cl.

| | |
|---|---|
| ***B41J 23/00*** | (2006.01) |
| ***H01L 23/60*** | (2006.01) |
| ***H05F 1/00*** | (2006.01) |
| ***B41J 19/00*** | (2006.01) |

(52) U.S. Cl.

CPC ................. *H05F 1/00* (2013.01); *B41J 19/005* (2013.01); *B65H 2801/36* (2013.01)

(58) Field of Classification Search

CPC ............ B41J 19/00; B41J 25/001; B41J 1/20; B41J 1/22; B41J 1/60; B41J 19/202; B41J 19/30; B41J 2/01; B41J 2/175; H05K 9/0067; H05K 9/0079; H05F 1/00

USPC .............................................. 347/37, 58, 108

See application file for complete search history.

(56) References Cited

U.S. PATENT DOCUMENTS

| | | | | |
|---|---|---|---|---|
| 5,692,842 | A * | 12/1997 | Sasai et al. | 400/59 |
| 5,971,525 | A * | 10/1999 | Inoue | B41J 29/00 347/50 |
| 6,170,940 | B1 * | 1/2001 | Shinada et al. | 347/86 |
| 6,456,504 | B1 * | 9/2002 | LoForte et al. | 361/799 |
| 6,481,836 | B1 * | 11/2002 | Paroff et al. | 347/85 |
| 6,601,944 | B1 * | 8/2003 | Kawazoe | 347/37 |
| 6,959,980 | B2 * | 11/2005 | Heberling et al. | 347/50 |
| 7,618,123 | B2 * | 11/2009 | Ohashi et al. | 347/50 |
| 8,016,388 | B2 * | 9/2011 | Toge et al. | 347/50 |
| 2002/0118248 | A1 * | 8/2002 | Inoue et al. | 347/37 |
| 2006/0250451 | A1 * | 11/2006 | Suzuki et al. | 347/58 |
| 2011/0007112 | A1 * | 1/2011 | Takei et al. | 347/37 |
| 2011/0279549 | A1 * | 11/2011 | Miyazaki et al. | 347/54 |

FOREIGN PATENT DOCUMENTS

| | | |
|---|---|---|
| JP | 03-246039 A | 11/1991 |
| JP | 06-143555 A | 5/1994 |

(Continued)

*Primary Examiner* — Matthew Luu
*Assistant Examiner* — Patrick King
(74) *Attorney, Agent, or Firm* — Nutter McClennen & Fish LLP; John J. Penny, Jr.

(57) ABSTRACT

A recording apparatus performing recording with a recording head mounted on a carriage capable of scanning with respect to a recording medium includes a circuit board provided on the carriage; a sheet metal member disposed on an upper surface of the carriage; a flexible wiring member which is disposed to draw around an outer surface of the carriage and makes the circuit board and an apparatus body side to be electrically connected; and a grounding spring which is disposed on the carriage and grounds the sheet metal member to the apparatus body side, wherein the grounding spring serves as a fixing member which fixes the flexible wiring member to the carriage.

5 Claims, 6 Drawing Sheets

(56) References Cited

FOREIGN PATENT DOCUMENTS

| | | | |
|---|---|---|---|
| JP | 10-044450 | A | 2/1998 |
| JP | 10-226084 | A | 8/1998 |
| JP | 2003-165206 | A | 6/2003 |
| JP | 2006-015531 | A | 1/2006 |
| JP | 2006-082381 | A | 3/2006 |
| JP | 2006-102984 | A | 4/2006 |
| JP | 2011-156780 | A | 8/2011 |

* cited by examiner

RECORDING APPARATUS

BACKGROUND

1. Technical Field

The present invention relates to a recording apparatus.

2. Related Art

In the related art, as an ink jet type recording apparatus, a so-called off-carriage type recording apparatus has been known in which an ink receiving body provided in an ink cartridge is connected to a recording head provided in a lower surface of a carriage via an ink supply tube. In such an off-carriage type recording apparatus, since the recording head is mounted on the carriage and reciprocates, for example, static electricity is likely to be generated when the ink supply tube or a flexible flat cable which makes the carriage and an apparatus body side to be connected moves following the reciprocating movement of the carriage. Then, a liquid ejecting apparatus has been known in which a metal member on the carriage is grounded by a ground member (see, for example, JP-A-2006-102984).

In addition, when the flexible flat cable moves following the reciprocating motion of the carriage, the upper portion of the flexible flat cable is collapsed and the collapsed portion comes into contact with or is caught by the peripheral portion so that breakage of a wire or peeling of the coating occurs, and it would result in short circuit or malfunction of the carriage. Thus, the recording apparatus has been known in which independence of the flexible flat cable is improved and then the collapse due to the weight of the flexible flat cable is prevented (see, for example, JP-A-2006-82381).

However, in the technique disclosed in JP-A-2006-102984, problem due to the static electricity can be prevented and in the technique disclosed in JP-A-2006-82381, the collapse of the flexible flat cable can be prevented. However, the flexible flat cable generates noise or noise comes from the exterior so that there is a concern that malfunctions of the carriage may occur.

SUMMARY

An advantage of some aspects of the invention is to provide a recording apparatus in which the occurrence of problems due to static electricity and noise is prevented.

According to an aspect of the invention, there is provided a recording apparatus that performs recording with a recording head mounted on a carriage capable of scanning with respect to a recording medium including a circuit board provided on the carriage; a sheet metal member disposed on an upper surface of the carriage; a flexible wiring member which is disposed to draw around an outer surface of the carriage and makes the circuit board and an apparatus body side to be electrically connected; and a grounding spring which is disposed on the carriage and grounds the sheet metal member to the apparatus body side, wherein the grounding spring serves as a fixing member which fixes the flexible wiring member to the carriage.

According to the recording apparatus of the aspect of the invention, since the sheet metal member is grounded by the grounding spring, the static electricity charged on the sheet metal member can be discharged to the apparatus body side and it is possible to prevent occurrence of problems due to the static electricity. In addition, the grounding spring is fixed to the carriage in a state of covering at least a portion of the flexible wiring member so that it is possible to prevent the propagation of noise, which is generated in the flexible wiring member, to the periphery via the grounding spring. In addition, it is possible to reliably prevent the entrance of noise into the flexible wiring substrate in the portion where the grounding spring covers the flexible wiring member. Accordingly, it is possible to provide the recording apparatus in which occurrence of the problems due to the static electricity and the noise is prevented.

In the recording apparatus, the grounding spring may be disposed on the carriage to cover the outer surface side of the flexible wiring member.

According to the configuration, since the grounding spring covers the outer surface side of the flexible wiring member, a contact area with the flexible wiring member is increased and the noise generated in the flexible wiring member can be preferably avoided from propagating to the periphery, and it is possible to preferably prevent the entrance of the noise into the flexible wiring substrate.

In the recording apparatus, the sheet metal member may be a holding section which holds a supply tube supplying a liquid material to the recording head.

According to the configuration, the supply tube is further reliably held by the sheet metal member even during the scanning of the carriage. Accordingly, it is possible to suppress the generation of the static electricity due to the vibration of the supply tube during the movement of the carriage.

The recording apparatus may further include a sensor detecting a position of the carriage, and the flexible wiring member may make the sensor and the circuit board to be electrically connected.

According to the configuration, since the entrance of the noise into the sensor is prevented, it is possible to perform the detection of the position of the carriage with high accuracy.

The recording apparatus may further include a guide section which comes into sliding contact with a guide shaft and scans the carriage, and the guide section may be electrically connected to the grounding spring.

According to the configuration, it is possible to preferably escape the static electricity generated when the guide section comes into sliding contact with the guide shaft via the grounding spring.

In the recording apparatus, a plurality of the guide sections may be provided along the longitudinal direction of the guide shaft, and the plurality of guide sections may be connected to each other via a metal member.

According to the configuration, it is possible to escape the static electricity generated in the plurality of the guide sections via the metal member, the sheet metal member and the grounding spring.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the embodiment of the invention will be described with reference to the drawings. In addition, in each of the drawings, in order to make the size of each member recognizable to a degree, the scale of each member is different from the practical scale. In the embodiment, a printing apparatus is applied to a large printer which can perform printing on a printing paper having a width up to A1 or B1 size.

Figure 1:
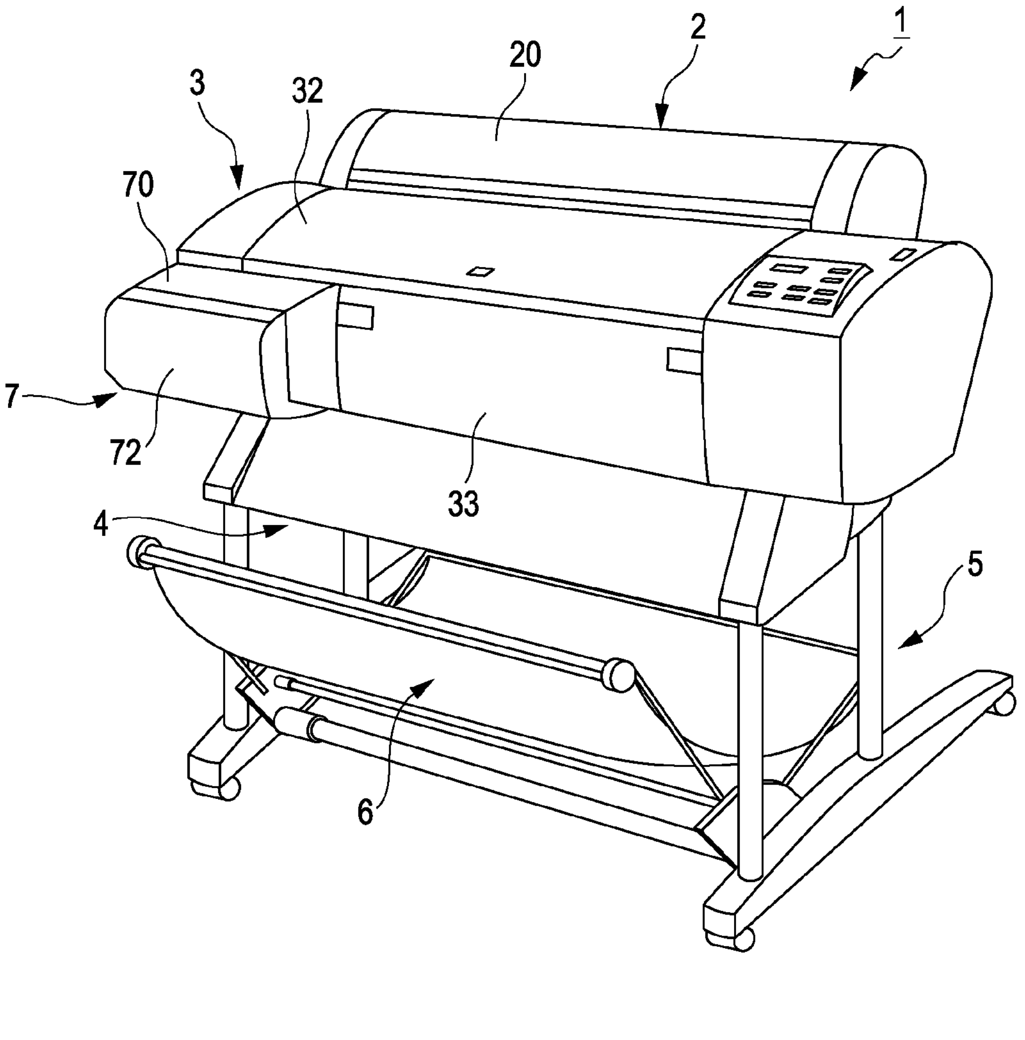
FIG. 1 is a view illustrating a perspective configuration of a printer according to an embodiment.
Figure 2:
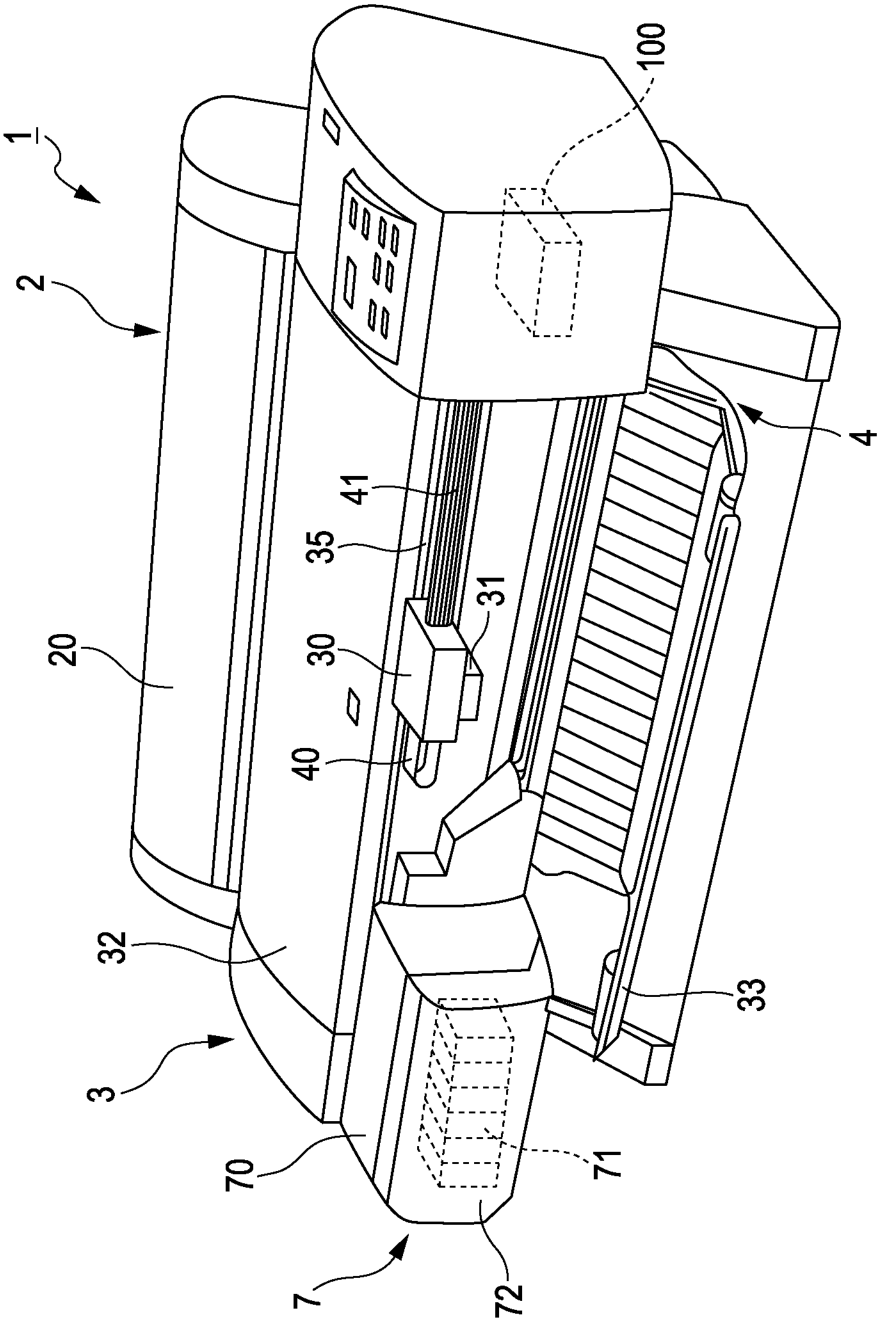
FIG. 2 is a perspective configuration view illustrating a state where a front cover of the printer is opened.

FIG. 1 is a view illustrating a perspective configuration of the printer according to the embodiment and FIG. 2 is a perspective configuration view illustrating a state where a front cover of the printer is opened.

The printer 1 includes a paper feeding section 2, a printing section 3 and a paper discharging section 4 which configure a printer body, a leg device 5 and a discharged-paper receiving device 6. The paper feeding section 2 is provided to protrude to the upside on the rear of printer 1 and the inside thereof has a roll paper (a recording medium). A roll paper cover 20 is attached to be opened or closed to cover the roll paper.

The printing section 3 has an upper cover 32 and a front cover 33. The printing section 3 has a carriage 30, in which a printing head 31 is mounted in a space partitioned by the upper cover 32 and the front cover 33. An ink tube (a supply tube) 41 is connected to the printing head 31 mounted on the carriage 30. The printing head 31 is configured of a so-called ink jet head in which a plurality of nozzles for ejecting the ink supplied via the ink tube 41 are formed.

The front cover 33 is configured such that the lower portion thereof positioned on a paper transportation side is rotatably supported on the printer body. The carriage 30 is supported to be movable along a guide shaft 35 provided in the main scanning direction. The carriage 30 is adapted to reciprocate being guided by the guide shaft 35 when a carriage driving device (not illustrated) is actuated.

A cartridge holder 7 configuring an ink supply device is included in the front side of the printing section 3. Ink cartridges 71 of six colors (yellow, light magenta, light cyan, magenta, cyan and black) are accommodated side-by-side and detachably from front side of the printer 1 in a holder body 70 of the cartridge holder 7.

A holder cover 72 covering the inserted ink cartridges 71 is provided to be opened or closed in the holder body 70. Each color ink is supplied to the printing head 31 through the ink tube 41 and is used to be printed on the printing paper.

Printing operation of the printer 1 described above is performed such that the print is performed on the roll paper fed from the paper feeding section 2 in the printing section 3 and the roll paper is discharged obliquely downwards in the front side of the printer 1 via the paper discharging section 4. A cutter (not illustrated) for cutting the roll paper is provided between the printing section 3 and the paper discharging section 4. The roll paper is cut by the cutter after the print is finished and is received in the discharged-paper receiving device 6.

Figure 3:
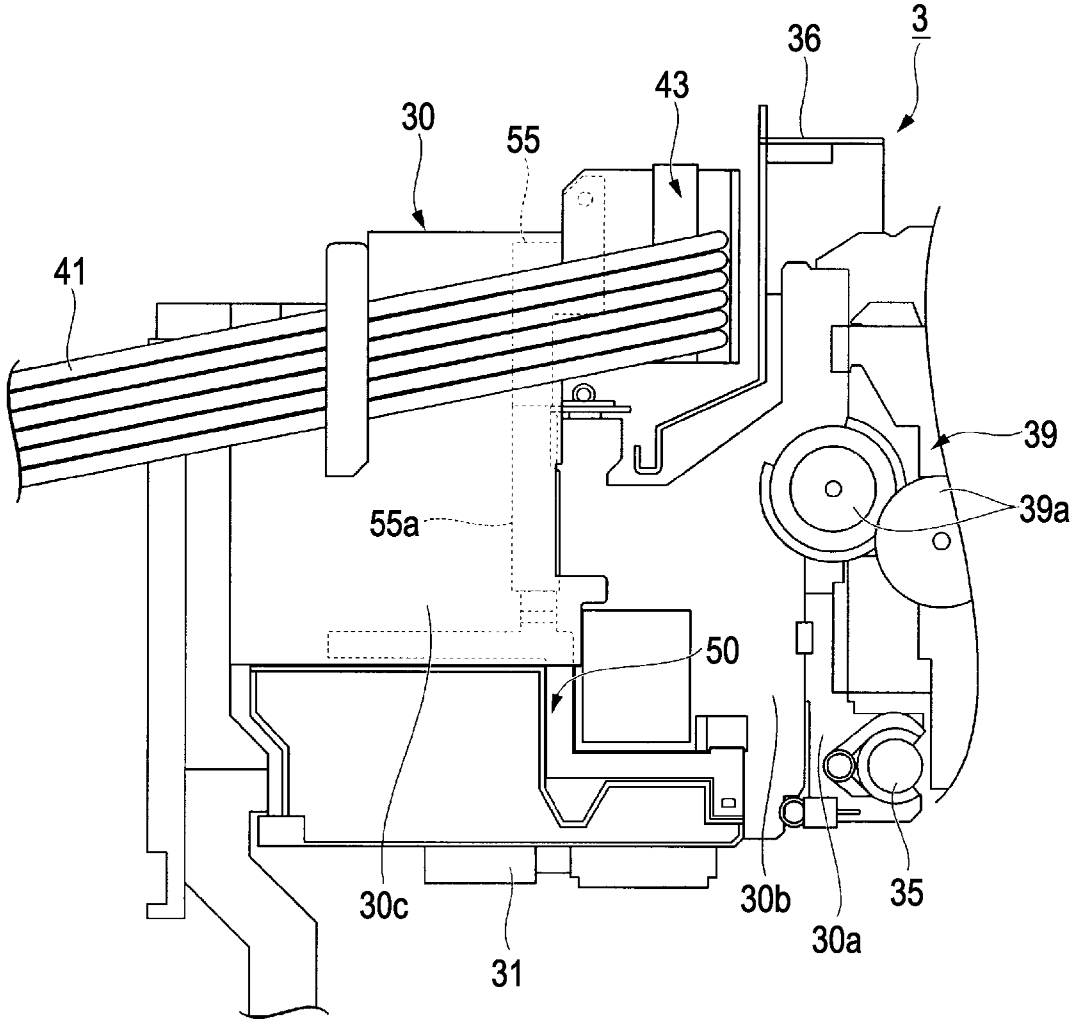
FIG. 3 is a view illustrating a configuration of a main portion of a printing section viewed from the side of the printer.
Figure 4:
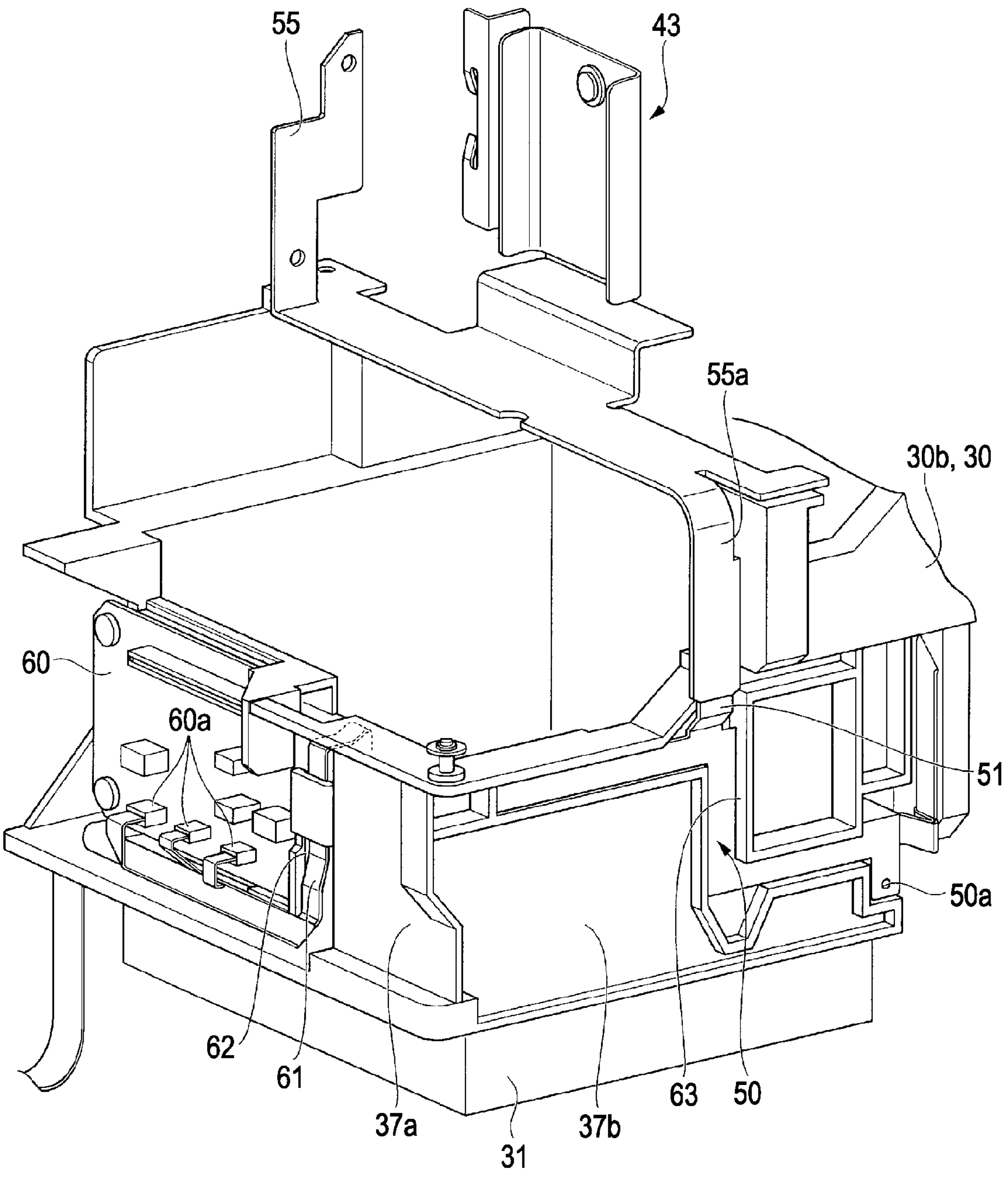
FIG. 4 is a cross-sectional view illustrating a configuration of a main portion around a carriage.
Figure 5:
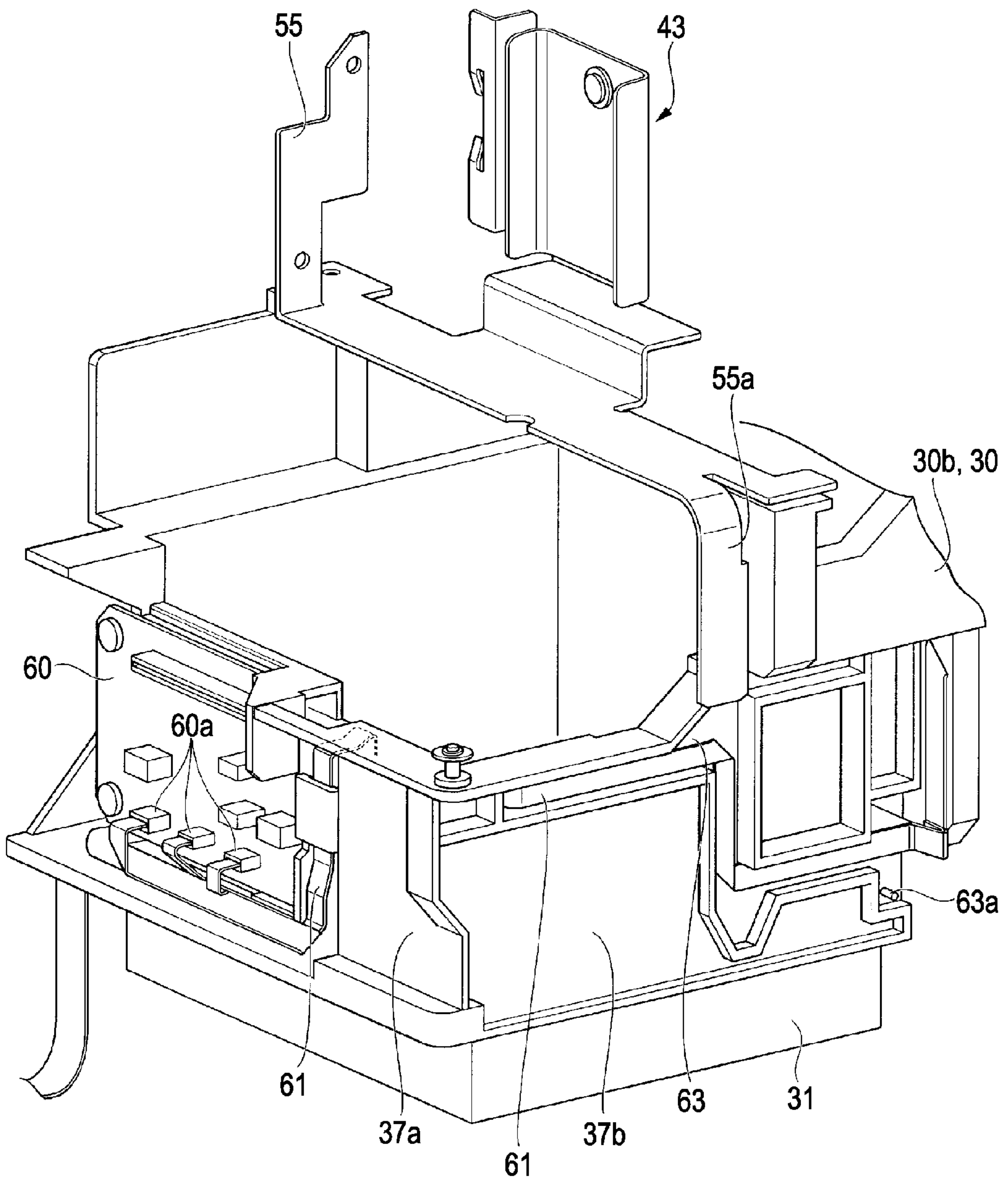
FIG. 5 is a rear view illustrating a configuration of a main portion of the printer.
Figure 6:
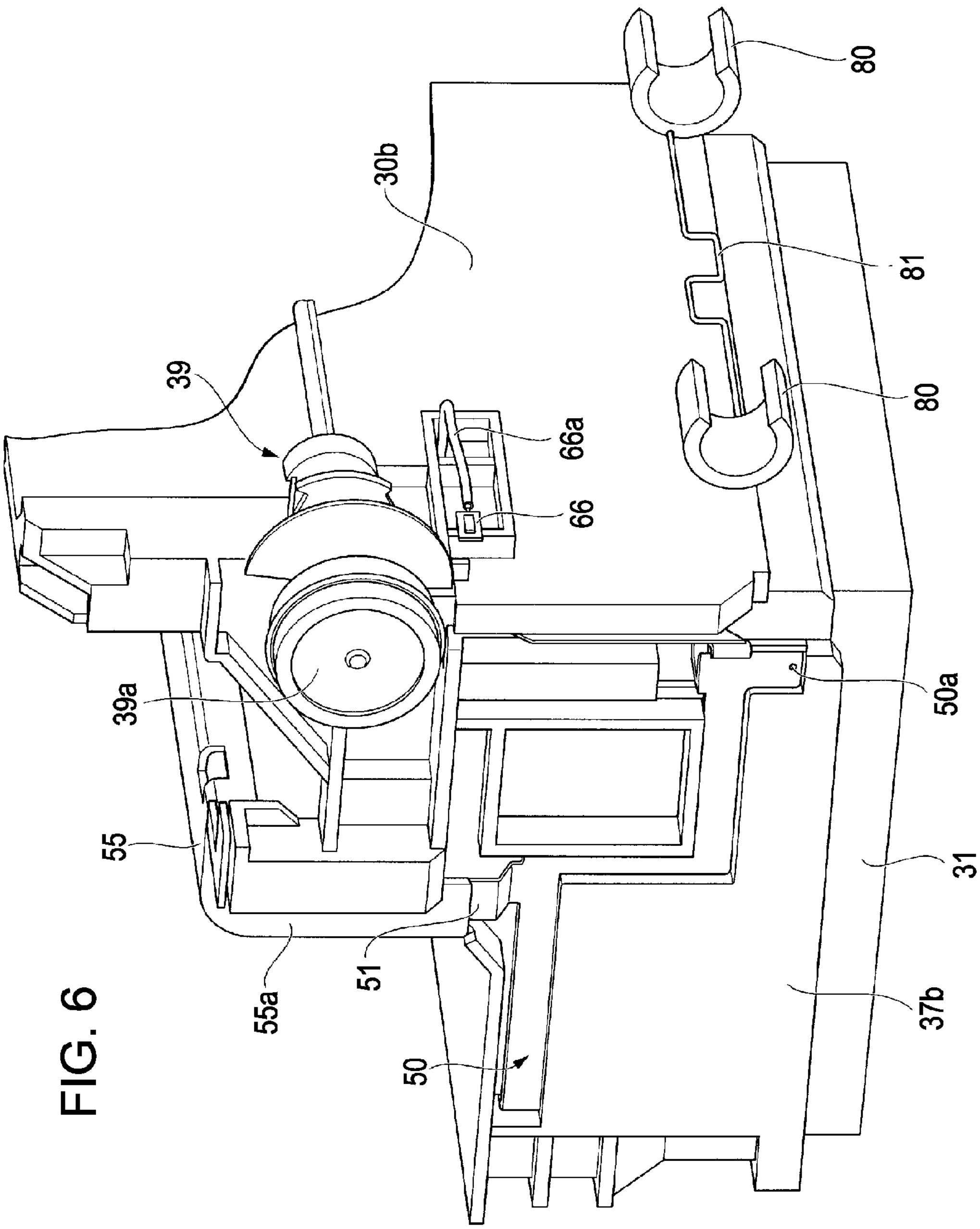
FIG. 6 is a perspective view illustrating a configuration of a main portion of the carriage viewed from the rear side thereof.

FIG. 3 is a view illustrating a configuration of a main portion of the printing section 3 viewed from a side view of the printer 1. FIGS. 4 and 5 is a perspective view illustrating a configuration of a main portion of the carriage 30. FIG. 5 is a view illustrating a configuration of the main portion of the carriage 30 in which a grounding spring 50 described above from FIG. 4 is removed. FIG. 6 is a perspective view of the carriage 30 viewed from the rear side thereof and a view illustrating a configuration of a main portion of the carriage 30.

As illustrated in FIG. 3, the printing section 3 has the carriage 30, the printing head 31 mounted on the carriage 30 and a driving section 39 which allows the carriage 30 to scan along the guide shaft 35. The carriage 30 has a main carriage **30*a* moving along the guide shaft 35, a sub-carriage 30*b* mounted on the main carriage 30*a* and a cover member 30*c* covering the inside of the sub-carriage 30*b***.

The printing head 31 is installed in the lower side of the sub-carriage **30*b*. A cable fixing section 36 is disposed in the upper side of the main carriage 30*a* to fix one end side of a flat cable 40. The driving section 39 has a motor section (not illustrated) and a plurality of transmission gears 39*a* transmitting a driving force of the motor section. The flat cable 40 also has a function to electrically connect a circuit board 60 (see, FIG. 4) mounted on the carriage 30 described below and a controller 100**.

The sub-carriage **30*b* is arranged in a state where the grounding spring 50 is drawn around in a concave section disposed in the surface thereof. The grounding spring 50 is intended to allow a sheet metal member 55 disposed on the upper side of the sub-carriage 30*b* described below to ground on the printer body side of the printer 1 In addition, a detailed configuration of the grounding spring 50** will be described below.

The ink tube 41 and the flat cable 40 transmitting a printing signal from the controller 100 (see, FIG. 2) to the printing head 31 side are connected to the printing head 31 mounted on the carriage 30.

The flat cable 40 is configured of, for example, an elongated flexible wiring substrate (a film base material) such as polyimide and has wiring for transmitting various signals to the carriage 30 side. In the printer 1 according to the embodiment, one end of the flat cable 40 is connected to the printing head 31 and the other end is connected to a connector of the controller 100 mounted on the printer body side of the printer 1.

As illustrated in FIGS. 4 and 5, the sheet metal member 55 is mounted on the upper surface of the sub-carriage **30*b*. An extension section 55*a* extending downwards is formed in one end side of the sheet metal member 55. The extension section 55*a* is in a state of coming into contact with the grounding spring 50**.

In addition, the sheet metal member 55 integrally has a tube fixing section 43 holding the ink tube 41. As described above, since the tube fixing section 43 is formed integrally with the sheet metal member 55, the tube fixing section 43 has a predetermined intensity or more and can hold the ink tube 41 without backlash. Accordingly, an amount of the static electricity generated by the vibration can be reduced by suppressing the vibration of the ink tube 41 due to the reciprocating motion of the carriage 30 along the guide shaft 35.

The circuit board 60 is mounted on the front surface of the sub-carriage **30*b*. The circuit board 60 has a driving circuit for driving various sensors mounted on the printing head 31 and the carriage 30. A flat cable (a flexible wiring substrate) 61 is drawn from each of connectors 60*a* provided in the circuit board 60**.

The flat cable 61 is configured of, for example, an elongated flexible wiring substrate (a film material) such as polyimide and has a plurality of wirings on which various signals flow. The flat cable 61 has a plurality of wirings which allow the circuit board 60 side to connect to the printing head 31 or various sensors side. In addition, the flat cable 61 is electrically connected to the flat cable 40 fixed to the cable fixing section 36 and is electrically connected to the controller 100 via the flat cable 40. In other words, the circuit board 60 is electrically connected to the controller 100 via the flat cables 40 and 61.

After the flat cable 61 is drawn to the upper side through a cable draw-around section 62 provided in the front surface 37*a* of the sub-carriage 30*b*, the flat cable 61 is drawn to a lateral surface 37*b* by turning to change 90 degrees. The flat cable 61 drawn to the lateral surface 37*b* of the sub-carriage 30*b* is drawn around in a concave section 63 provided in the lateral surface 37*b*.

The concave section 63 bends the lateral surface 37*b* of the sub-carriage 30*b* several times in the depth direction, the downward direction and the depth direction. The flat cable 61 drawn around in the concave section 63 may be drawn around a desired position. In addition, a protrusion 63*a* engaging the grounding spring 50 is formed in the concave section 63 as described below.

In the embodiment, the grounding spring 50 is disposed in the concave section 63 provided in the lateral surface 37*b* of the sub-carriage 30*b* to cover the flat cable 61. One end of the grounding spring 50 has an opening 50*a* which is engaged to the protrusion 63*a* provided in the concave section 63. The grounding spring 50 is fixed to the lateral surface 37*b* of the sub-carriage 30*b* by engaging the protrusion 63*a* in the opening 50*a*.

In addition, the grounding spring 50 has an abutment section 51 abutting the sheet metal member 55. The abutment section 51 is molded to bend upward with respect to a portion which is disposed in the concave section 63 of the grounding spring 50. Accordingly, the abutment section 51 reliably comes into contact with the sheet metal member 55 which is positioned in a position separated from the bottom surface of the concave section 63.

When the grounding spring 50 is disposed in the concave section 63, the grounding spring 50 is in a state of being got into below the sheet metal member 55. According to the configuration, the sheet metal member 55 may be used as a member to fix the grounding spring 50. Thus, since the grounding spring 50 is fixed in two locations, that is, in the sheet metal member 55 and the protrusion 63*a*, the grounding spring 50 is reliably held to the sub-carriage 30*b*. Accordingly, it is possible to prevent occurrence of problems that the grounding spring 50 is deviated due to the vibration according to the motion of the carriage 30.

As described above, the grounding spring 50 also functions as a fixing member to fix the flat cable 61, which is drawn around to cover the outer surface of the carriage 30, to the lateral surface 37*b* of the sub-carriage 30*b*.

The grounding spring 50 is formed of a metal material by sheet-metal processing and has a thickness of a certain degree of flexibility. Accordingly, since shape of the grounding spring 50 may easily be elastically deformed when disposed in the concave section 63, installation work in the concave section 63 is easily carried out and assembly property thereof is excellent.

As illustrated in FIG. 6, the sub-carriage 30*b* has a guide section 80 which slidably holds the entire carriage 30 with respect to the guide shaft 35. In the embodiment, two guide sections 80 are provided in the sub-carriage 30*b*. The sub-carriage 30*b* (the carriage 30) may reciprocate in the longitudinal direction of the guide shaft 35 along the guide shaft 35, based on the above described configuration.

The guide section 80 is electrically connected to the grounding spring 50 via a metal member (not illustrated). According to the configuration, at least one side of the guide section 80 is in a state of being grounded to the printer body side via the grounding spring 50. Thus, the static electricity, which is generated by the guide section 80 in sliding contact with the grounding spring 50, may be discharged to the outside of the printer 1 using the grounding spring 50. In addition, two guide sections 80 are electrically connected to each other via a conducting section (a metal member) 81.

In addition, the sub-carriage 30*b* has an encoder reading sensor 66 to read an encoder (not illustrated) which detects the position of the sub-carriage 30*b* with respect to the guide shaft 35. The sensor 66 is connected to a lead wire 66*a* drawn from the flat cable 61 and is electrically connected to the circuit board 60 via the lead wire 66*a* (the flat cable 61).

Accordingly, information read by the sensor 66 is transmitted to the circuit board 60 side and is transmitted from the circuit board 60 to the controller 100 side via the flat cables 40 and 60.

Next, operation of the printer 1 will be described. The following description mainly describes the operation obtaining the effect of the grounding spring 50 that is a characteristic portion of the printer 1 according to the embodiment.

When the printer 1 performs the printing process, the controller 100 drives the printing head 31 and the printing head 31 ejects the ink on the roll paper supplied from the paper feeding section 2. The controller 100 actuates the carriage driving device and the carriage 30 scans along the guide shaft 35 during the printing process so that the ink may be ejected the entire area of the roll paper in the width direction.

However, since the flat cable 61 is connected to the circuit board 60 as described above, various signals flow on the wiring of the flat cable 61 during the printing process. Since the flat cable 61 is formed of, for example, a plurality of wirings made of a film material such as polyimide, there is a concern that noise may enter from the outside.

As described above, when the noise enters into the flat cable 61, a normal signal does not enter into the circuit board 60 and there is a concern that the operation of the printing head 31 may fail or the reading in the various sensors may fail.

When the operation of the printing head 31 fails, landing accuracy of the ink from the printing head 31 to the roll paper is reduced and a desired print quality may not be obtained. In addition, when the reading in the various sensors fails, for example, the control of the position of the carriage 30 cannot be performed with high accuracy and then a desired print quality also may not be obtained similarly.

On the other hand, according to the printer 1 of the embodiment, since the grounding spring 50 is fixed to the sub-carriage 30*b* in a state where the grounding spring 50 covers the outer surface side of the flat cable 61, it is possible to reliably prevent the entrance of the noise from the periphery into the flat cable 61. Accordingly, since the noise is prevented from entering the sensor 66, it is possible to perform the detection of the position of the carriage 30 with high accuracy.

In addition, since the flat cable 61 has a plurality of wirings on which various signals flow, there is a concern that the printer 1 may be a noise source in which the noise may be generated in the periphery. As described above, when the noise is generated in the periphery, there is a concern that a problem such as malfunction or the like of electronic equipment of the periphery may occur.

On the other hand, according to the printer 1 of the embodiment, since the grounding spring 50 is fixed to the sub-carriage 30*b* in a state where the grounding spring covers the flat cable 61, it is possible to prevent the propagation of the noise generated in the flat cable 61 to the periphery via the grounding spring 50.

In addition, since one end sides of the flat cable 40 and the ink tube 41 are connected to the carriage 30, there is a concern that static electricity may occur due to the motion of the flat cable 40 and the ink tube 41 following the reciprocation of the carriage 30 which is performed along the guide shaft 35.

Since, the grounding spring 50 fixes the flat cable 61 to the lateral surface 37*b* of the sub-carriage 30*b* to cover the outer surface side thereof, it is possible to secure a increased contact area with the flat cable 61. Accordingly, it is possible to preferably prevent the entrance of the noise into the flat cable 61 while preferably avoiding the propagation of the noise generated in the flat cable 61 to the periphery.

In the embodiment, there is a concern that the static electricity generated at this time may be charged on the sheet metal member 55 disposed on the upper portion of the sub-carriage 30*b*. When the static electricity is charged in the printer 1, the operation of the printer 1 fails by a short of the circuit board 60 due to the static electricity and a desired print quality may not be obtained by the abnormal operation. In addition, there is a concern that the reliability of the printer 1 may be reduced.

On the other hand, according to the printer 1 of the embodiment, the grounding spring 50 performs the ground of the sheet metal member 55 to the printer body side of the printer 1 so that the static electricity charged on the sheet metal member 55 may be discharged to the apparatus body side. Accordingly, it is possible to prevent occurrence of problems caused by the static electricity.

In addition, according to the printer 1 of the embodiment, since the guide section 80 slidably holding the carriage 30 with respect to the guide shaft 35 is provided and the guide section 80 is grounded to the printer body side via the grounding spring 50, the static electricity generated by the guide section 80 in sliding contact with the grounding spring 50 may be discharged to the outside of the printer 1 (the printer body) by the grounding spring 50.

In addition, since two guide sections 80 are electrically connected to each other by the conducting section 81, in the configuration where for example, only one of the guide sections 80 is electrically connected to the grounding spring 50, even though the static electricity is generated in the other guide sections 80, the static electricity generated in the other guide section 80 may flow in the one guide section 80 side via the conducting section 81.

The static electricity flowed in the one guide section 80 side is discharged to the outside of the printer 1 via the grounding spring 50. Thus, according to the configuration of the embodiment, even though the static electricity is generated in the guide section 80 which is not directly connected to the grounding spring 50, the static electricity may be reliably discharged to the outside of the printer 1 via the grounding spring 50.

As described above, according to the printer 1 of the embodiment, the static electricity charged in the sheet metal member 55 may be discharged to the printer body side by the grounding spring 50. In addition, since the flat cable 61 is fixed to the carriage 30 (the sub-carriage 30*b*) in a state of being covered by the grounding spring 50, it is possible to reliably prevent the propagation of the noise generated in the flat cable 61 to the periphery or entrance of the noise into the flat cable 61.

Accordingly, it is possible to provide the printer 1 having high reliability in which the occurrence of the problems due to the static electricity and the noise is prevented.

In addition, the invention is not limited to the configuration according to the embodiment described above and may be appropriately changed in a range without departing the gist of the invention.

For example, the above embodiment has the configuration capable of scanning the carriage 30 by two guide sections 80 in sliding contact with the guide shaft 35, however, the number of the guide sections 80 is not limited to the embodiment and three or more guide sections 80 may be provided. When the number of the guide sections 80 is great, backlash of the carriage 30 and the guide shaft 35 may be eliminated and the printing head 31 may be moved with high accuracy so that the landing position of the ink droplet may be controlled with high accuracy and high quality printing can be performed.

In addition, the shape of the grounding spring 50 is not limited to the above embodiment and may be changed at any time, depending on how the flat cable 61 is drawn around. In addition, the above embodiment has the configuration in which the grounding spring 50 covers the entire outer surface of the flat cable 61 drawn around the lateral surface 37*b* of the sub-carriage 30*b*, however, the effect of the invention may be obtained if the grounding spring 50 covers at least a portion of the flat cable 61.

In addition, in the above embodiment, the encoder reading sensor 66 is exemplified as the sensor to which the flat cable 61 is connected to detect the position information of the carriage 30, however, the invention is not limited to the embodiment. For example, the sensor to which the flat cable 61 is connected may be a paper detection sensor detecting presence or absence of the roll paper. According to the configuration, the grounding spring 50 covers the flat cable 61 in which detection signal of the paper detection sensor flows and entrance of the noise is prevented so that it is possible to prevent the problems of misdetection of the paper detection sensor due to the noise and a desired printing process can be performed with respect to the roll paper.

The entire disclosure of Japanese Patent Application No. 2012-98465, filed Apr. 24, 2012 is expressly incorporated by reference herein.

What is claimed is:

1. A recording apparatus performing recording with a recording head mounted on a carriage capable of scanning with respect to a recording medium, comprising:

a circuit board provided on the carriage;

a sheet metal member disposed on an upper surface of the carriage;

a flexible wiring member which is disposed to draw around an outer surface of the carriage so that it electrically connects the circuit board and an apparatus body; and a grounding spring which is disposed on the carriage and grounds the sheet metal member to the apparatus body, wherein the grounding spring serves as a fixing member which fixes the flexible wiring member to the carriage, wherein the sheet metal member is a holding section which holds a supply tube supplying a liquid material to the recording head.

2. The recording apparatus according to claim 1, wherein the grounding spring is disposed on the carriage to cover the outer surface side of the flexible wiring member.

3. The recording apparatus according to claim 1, further comprising:

a sensor detecting a position of the carriage, wherein the flexible wiring member electrically connects the sensor and the circuit board.

4. The recording apparatus according to claim 1, further comprising:

a guide section which comes into sliding contact with a guide shaft and scans the carriage, wherein the guide section is electrically connected to the grounding spring.

5. The recording apparatus according to claim 4, wherein a plurality of the guide sections are provided along a longitudinal direction of the guide shaft, and wherein the plurality of guide sections are connected to each other via a metal member.

* * * * *